United States Patent [19]

Okabe et al.

[11] Patent Number: 4,697,102
[45] Date of Patent: Sep. 29, 1987

[54] BIPOLAR LOGIC CIRCUIT HAVING TWO MULTI-EMITTER TRANSISTORS WITH AN EMITTER OF ONE CONNECTED TO THE COLLECTOR OF THE OTHER TO PREVENT SATURATION

[75] Inventors: Takahiro Okabe, Nishitama; Makoto Hayashi; Katuhiro Morisuye, both of Kodaira; Tomoyuki Watanabe; Katsuyoshi Washio, both of Hachioji; Setsuo Ogura, Takasaki; Makoto Furihata, Sawa; Shizuo Kondo, Takasaki, all of Japan

[73] Assignees: Hitachi Microcomputer Engineering Co., Ltd.; Hitachi, Ltd., both of Tokyo, Japan

[21] Appl. No.: 737,872

[22] Filed: May 28, 1985

[30] Foreign Application Priority Data

May 28, 1984 [JP] Japan ................................ 59-106390
May 31, 1984 [JP] Japan ................................ 59-162454

[51] Int. Cl.$^4$ .................. H03K 19/013; H03K 19/082
[52] U.S. Cl. ..................................... 307/454; 307/456; 307/459; 307/463; 307/466; 307/299 A; 307/299 B; 307/300
[58] Field of Search ............... 307/443, 255, 280, 300, 307/456-458, 270, 254, 299 A, 299 B, 459, 463, 465-466, 477, 303, 454

[56] References Cited

U.S. PATENT DOCUMENTS

| | | | |
|---|---|---|---|
| 3,402,330 | 9/1968 | Archer | 307/456 |
| 3,522,444 | 8/1970 | Lourie | 307/456 |
| 3,588,851 | 6/1971 | Jordan | 307/254 X |
| 3,694,666 | 9/1972 | Briley | 307/456 |
| 3,961,351 | 6/1976 | Blatt | 307/456 X |
| 4,471,239 | 9/1984 | Ohba | 307/456 |
| 4,521,700 | 6/1985 | Blumberg | 307/299 A X |
| 4,564,773 | 1/1986 | Tanizawa et al. | 307/456 X |
| 4,584,490 | 4/1986 | West | 307/456 |

OTHER PUBLICATIONS

"Sylvania Universal High-Level Logic", *Sylvania* (pub.) pp. 1-4; 2/5/1965.
Chang et al, "Constant-Current TTL Circuit"; IBM-TDB; vol. 19, No. 4, p. 1234; 9/1976.

*Primary Examiner*—Stanley D. Miller
*Assistant Examiner*—D. R. Hudspeth
*Attorney, Agent, or Firm*—Antonelli, Terry & Wands

[57] ABSTRACT

A logic circuit is provided which includes a first multi-emitter transistor with its emitters coupled to a group of first input lines and a first transistor with its base coupled to the collector of said first multi-emitter transistor. A second transistor is also provided with its base coupled to the collector of said first transistor, said second transistor having a polarity opposite to that of said first multi-emitter transistor. A second multi-emitter transistor is connected with its base coupled to the collector of said second transistor and with its emitters coupled to a group of second input lines, and a third transistor is connected with its base coupled to the collector of said second multi-emitter transistor and with its collector coupled to an output line. The collector of said first multi-emitter transistor is coupled to the emitter of said second multi-emitter transistor in order to absorb minority carriers stored in the transistors. This feature significantly improves the circuit operating speed. A further feature is the provision of a logic circuit which is highly integrated and which consumes reduced amounts of electric power, while maintaining high-speed performance of the TTL circuit, by substituting a multi-collector transistor that reversely operates for an inverter portion of the TTL circuit.

4 Claims, 18 Drawing Figures

| A' | B' | C' | D' |
|----|----|----|----|
| 0  | 0  | 0  | 1  |
| 0  | 1  | 1  | 1  |
| 1  | 0  | 1  | 0  |
| 1  | 1  | 0  | 0  |

BIPOLAR LOGIC CIRCUIT HAVING TWO MULTI-EMITTER TRANSISTORS WITH AN EMITTER OF ONE CONNECTED TO THE COLLECTOR OF THE OTHER TO PREVENT SATURATION

BACKGROUND OF THE INVENTION

The present invention relates to a logic circuit of TTL (transistor-transistor logic), and particularly to a logic circuit that is adapted to a large-scale PLA (programmable logic array) which consumes reduced amount of electric power owing to the division of the array into circuit blocks.

Figure 1:
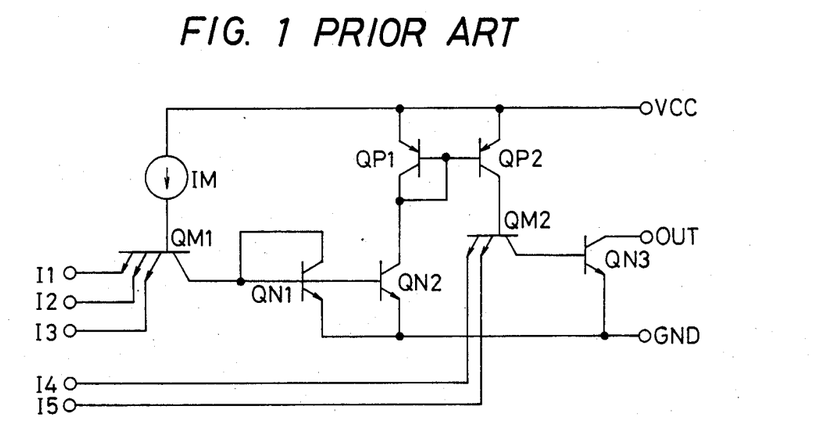
FIG. 1 is a diagram showing a conventional fundamental logic circuit.

In dealing with the PLA based upon TTL, if the number of input lines is doubled from n to 2n, the consumption of electric power abnormally increases by $2^n$ times Therefore, a standard design technique has been to divide the PLA circuit into a plurality of blocks to operate required blocks only, in order to reduce the consumption of electric power. FIG. 1 shows a fundamental logic circuit which constitutes such a block.

In FIG. 1 where inputs I1 to I5 are all assuming a high potential level, if now the input I1 only changes to ground level, an electric current of a current source IM flowing into the base of a multi-emitter npn transistor QM1 is allowed to flow into the input I1 via a first emitter of the transistor QM1. Therefore, the transistor QM1 goes into a conductive state, and the collector potential quickly changes a level close to ground voltage due to the amplification of current. Therefore, npn transistors QN1, QN2 are instantaneously rendered nonconductive and, then, pnp transistors QP1, QP2 are rendered nonconductive, so that no current flows into the base of the multi-emitter npn transistor QM2 and the npn transistor QN3 is rendered nonconductive.

In the above-mentioned operation, no power is consumed by the transistor QM2 as long as the transistor QP2 remains nonconductive. That is, a low-power type PLA is realized in which the electric power is not consumed by unnecessary portions. In this connection, logic circuits have also been disclosed in Japanese patent publication No. 33729/1983 and Japanese patent Laid-Open No. 120386/1978.

In carrying out the above-mentioned operation, however, when the transistor QP2 is rendered nonconductive so that no current flows into the base of the transistor QM2 and that the transistor QN3 is rendered nonconductive, a time is required to extinguish minority carriers that are stored in the collector of the transistor QM2 and in the base and emitter of the transistor QN3. Therefore, the timing for rendering the transistor QN3 nonconductive is delayed, making it difficult to perform the operation at high speeds.

SUMMARY OF THE INVENTION

In order to eliminate the above-mentioned defect inherent in the conventional art, the object of the present invention is to provide a large-scale PLA circuit of the TTL type which enables the fundamental logic circuit to effect the switching operation at a high speed so that the TTL-type PLA can be divided into blocks, which consumes the electric power in reduced amounts by dividing the PLA into blocks, and which performs the switching operation at a high speed, relying upon a simple and inexpensive method.

Another object of the present invention is to provide a bipolar logic circuit which features a high degree of integration and which consumes a reduced amount of electric power while maintaining high-speed performance of the conventional TTL circuit.

In order to achieve the above-mentioned objects, the present invention deals with a logic circuit which comprises a first multi-emitter transistor with its emitters coupled to a group of first input lines, a first transistor with its base coupled to the collector of said first multi-emitter transistor, a second transistor with its base coupled to the collector of said first transistor, said second transistor having a polarity opposite to that of said first multi-emitter transistor, a second multi-emitter transistor with its base coupled to the collector of said second transistor and with its emitters coupled to a group of second input lines, and a third transistor with its base coupled to the collector of said second multi-emitter transistor and with its collector coupled to an output line, wherein the collector of said first multi-emitter transistor is coupled to the emitter of said second multi-emitter transistor in order to absorb minority carriers stored in the transistors.

According to the present invention, furthermore, an inverter unit in the TTL circuit is replaced by a multi-collector transistor which operates in the reverse direction, in order to realize a logic circuit which is highly integrated and which consumes reduced amounts of electric power while maintaining high-speed performance of the TTL circuit.

DETAILED DESCRIPTION OF THE INVENTION

First and second embodiments of the present invention will be described below in conjunction with FIG. 2 to FIG. 6C.

Embodiment 1

Figure 2:
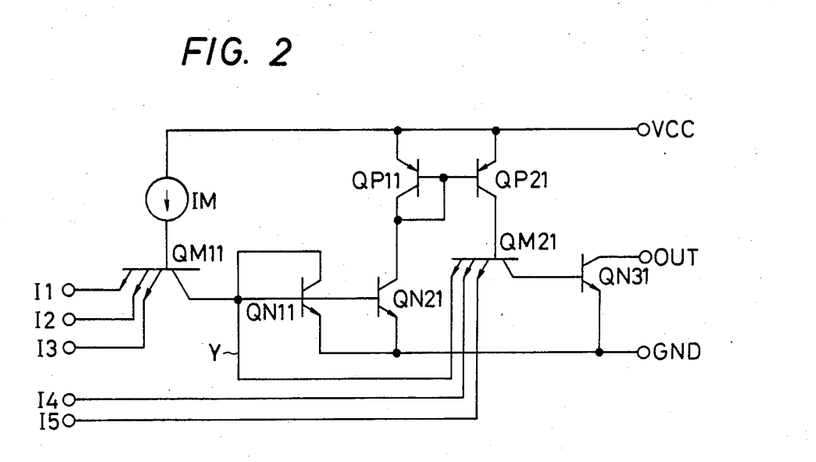
FIG. 2 is a diagram showing a fundamental unit circuit according to a first embodiment of the present invention.

FIG. 2 is a diagram of a fundamental unit circuit for dividing a TTL-type PLA into blocks according to a first embodiment of the present invention.

In FIG. 2, symbols QM11, QM21 denote multi-emitter npn-type transistors, QN11, QN21 and QN31 denote npn-type transistors, QP11 and QP21 denote pnp-type transistors, I1 to I5 denote input (terminals), OUT denotes an output (terminal), and VCC and GND denote d-c power supply and graund terminals. What makes the circuit of FIG. 1 different from the circuit of FIG. 2 is the addition of a signal line Y; i.e., the transistor QM2 has an additional emitter which is connected to the collector of the transistor QM1.

In FIG. 2 where the inputs I1 to I5 are all assuming a high potential level, if now the input I1 only changes into ground potential level, an electric current of a current source IM flowing into the base of the transistor QM11 is allowed to flow into the input I1 via a first emitter of the transistor QM11. Therefore, the transistor QM11 is rendered conductive, and the collector voltage quickly assumes a level close to ground voltage due to the amplification of current. Therefore, the transistors QN11, QN21 are instantaneously rendered nonconductive and, at the same time, the transistor QM21 is rendered conductive through the signal line Y which is added. As the transistor QN21 is rendered nonconductive, the transistors QP11, QP21 are also rendered nonconductive, and no current flows into the base of the transistor QM21.

When the transistor QM21 is rendered conductive, on the other hand, the transistor QN31 is rendered nonconductive owing to the same current amplification function as that of the transistor QM11. Immediately thereafter, no current flows to the base of the transistor QM21; i.e., the transistor QM21 is rendered nonconductive, and the transistor QN31 is maintained nonconductive continuously.

Thus, one of the emitters of the multi-emitter npn transistor QM21 is connected to the collector of the transistor QM11 in order to absorb minority carriers stored in the collector of the transistor QM21 and in the base and emitter of the transistor QN31 at a moment when the collector of the transistor QM11 assumes ground potential level. Therefore, when the input I1 changes into ground potential level, the transistor QN31 can be rendered nonconductive at a high speed. In other words, a so-called switching operation can be performed at a high speed. Further, even when a large-scale PLA is made up of fundamental unit circuits of FIG. 2, a high-speed switching operation can be realized without adverely affecting any other functions.

Embodiment 2

Figure 3:
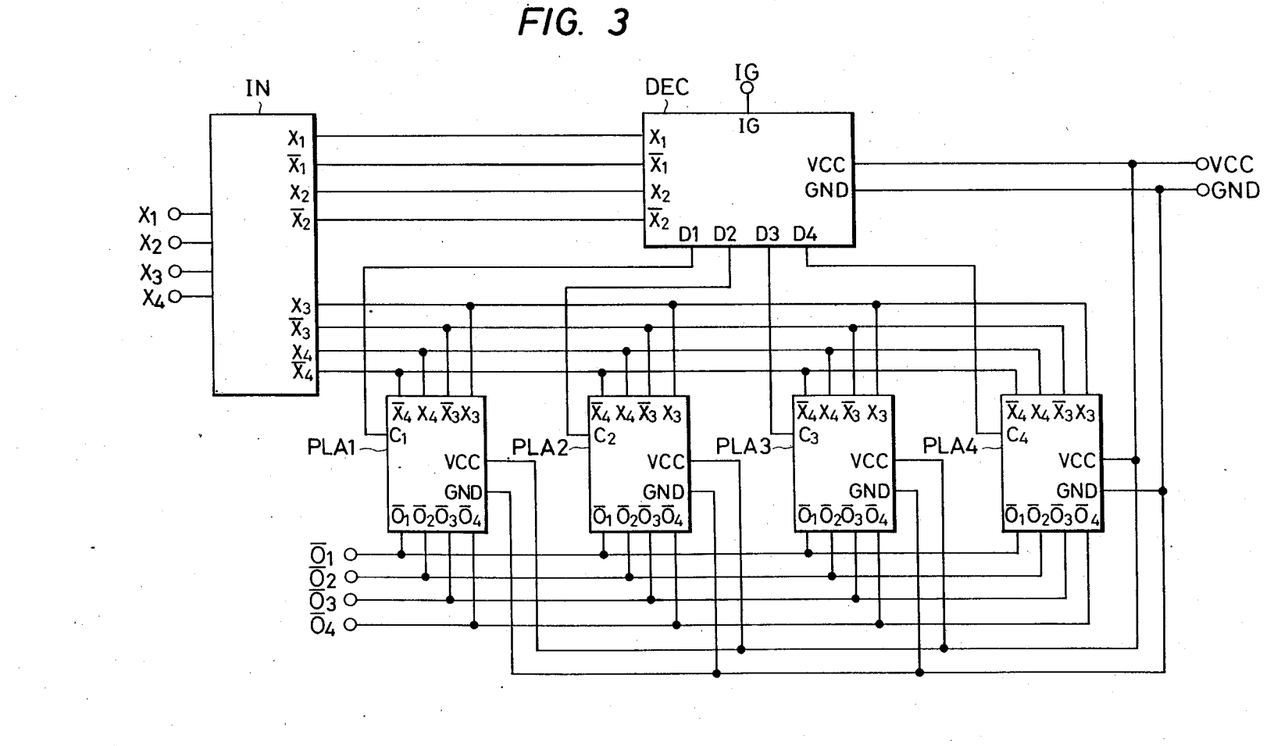
FIG. 3 is a block diagram of a large-scale PLA circuit.

A second embodiment of the invention will be explained below in conjunction with FIG. 3 to FIG. 6C. FIG. 3 is a block diagram of a large-scale PLA circuit having a four-bit input/output function, and FIG. 6A is a time chart of circuit operation of FIG. 3. In FIG. 3, symbol IN denotes an input circuit block which produces non-inverted signals X1 to X4 and inverted signals $\overline{X1}$ to $\overline{X4}$ that correspond to four input signals X1 to X4, symbol DEC denotes a decoder which produces through terminals D1, D2, D3, D4 thereof the currents proportional to a current supplied to a bias terminal of operating current IG responsive to logical products of four input signals X1, $\overline{X1}$, X2, $\overline{X2}$, symbols PLA1 to PLA4 denote sub-PLA circuits which, when a constant current is supplied to input control terminals C1 to C4, produce outputs corresponding to combinational logics of the four input signals X3, $\overline{X3}$, X4, $\overline{X4}$ through output terminals $\overline{O1}$, $\overline{O2}$, $\overline{O3}$, $\overline{O4}$ thereof, and symbols VCC, GND denote d-c power supply and ground terminals.

Here, when the input signals X1 and X2 are changed from the L level (ground potential level) to the H level (high potential level) while the input signals X3, X4 remain at the L level, the input circuit block IN which have received the input signals X1 to X4 sends the output signals X1, $\overline{X1}$, X2, $\overline{X2}$ and X3, $\overline{X3}$, X4, $\overline{X4}$ to the decoder DEC and to the sub-PLA's 1 to 4, respectively as shown in FIG. 6A. Then, the decoder DEC produces a current proportional to a current supplied to the bias terminal of operating current IG; the current being sent from an output (terminal) D1 of a logical product of the received output signals X1, $\overline{X1}$, X2, $\overline{X2}$, rendering the input control terminal C1 to assume the H level and enabling the sub-PLA 1 to operate.

Therefore, the sub-PLA 1 introduces input signals X3, $\overline{X3}$, X4, $\overline{X4}$, operates a combinational logic which has been programmed in advance, and produces output signals $\overline{O1}$, $\overline{O2}$ of the H level (high-impedance condition) and output signals $\overline{O3}$, $\overline{O4}$ of the L level.

Figure 4:
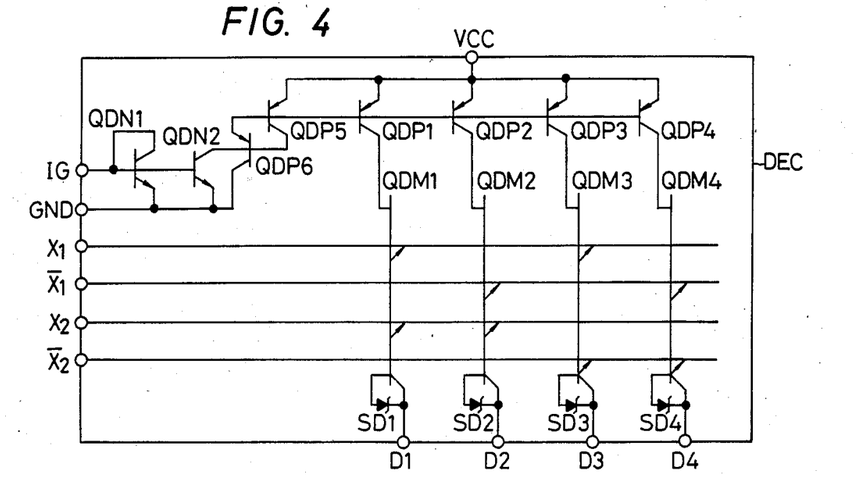
FIG. 4 is a diagram of a decoder circuit.
Figure 6A:
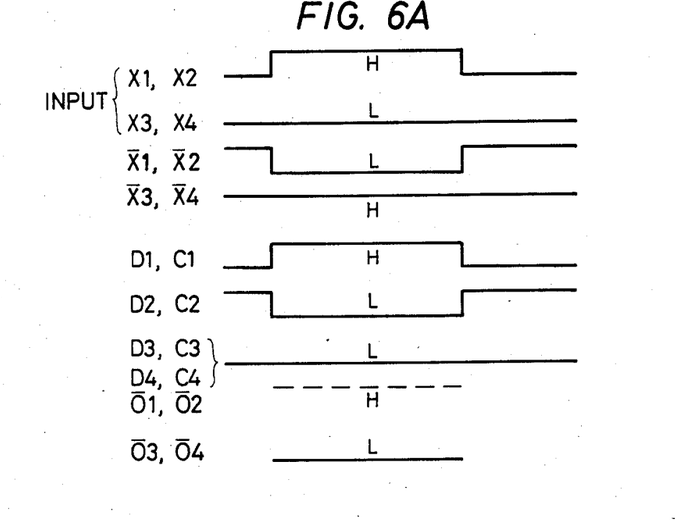
FIGS. 6A, 6B and 6C are operation time charts of FIGS. 3 to 5.
Figure 6B:
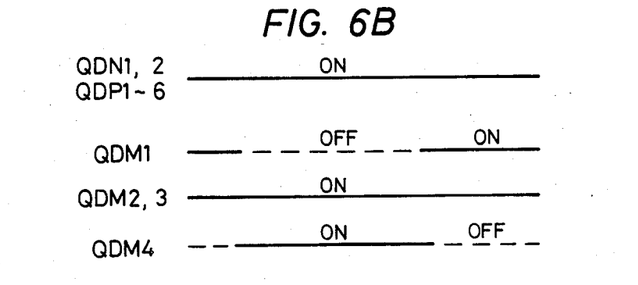

FIG. 4 is a diagram of a detector circuit, and FIG. 6B is the operation time chart of FIG. 4.

In FIG. 4, symbols QDN1, QDN2 denote npn transistors, symbols QDP1 to QDP6 denote lateral pnp transistors, symbols QDM1 to QDM4 denote multi-emitter npn transistors, and symbols SD1 to SD4 denote Shottky barrier diodes.

The transistors QDN1, QDN2 that receive a current from the bias terminal of operating current IG through the bases thereof, constitute a current mirror circuit together with the transistors QDP1 to QDP6, and supply a current proportional to the current (base current) of the bias terminal of operating current IG to the bases of transistors QDM1 to 4 via the transistors QDP 1 to QDP 4. Here, the current supplied through the bias terminal of operating current IG corresponds to the current source IM of FIG. 2.

Emitters of the transistors QDM 1 to 4 are so connected (AND plane) that the logical products of input signals X1, $\overline{X1}$, X2, $\overline{X2}$ will render the outputs D1 to D4 to assume the H level. As shown in FIGS. 6A and 6B, therefore, when the input signals X1, X2 have the H level and the input signals $\overline{X1}$, $\overline{X2}$ have the L level, the transistor QDM1 only is rendered nonconductive among the transistors QDM1 to QDM4 and the output signal D1 assumes the H level. The Schottky barrier diodes SD1 to SD4 work to prevent positive holes injected through the bases from flowing into the p-type semiconductor substrate when the operation condition of the transistors QDM1 to QDM4 is saturated, and at the same time, work to reduce the amount of positive holes accumulated in the collectors, so that the transistors exhibit increased switching speeds. Therefore, the Schottky barrier diodes SD1 to SD4 need not necessarily be provided. When the number of input signals is increased or when the logical expression is changed, the number of emitters of the transistors QDM1 to QDM4 and the wiring pattern should be changed to cope with the change.

Figure 5:
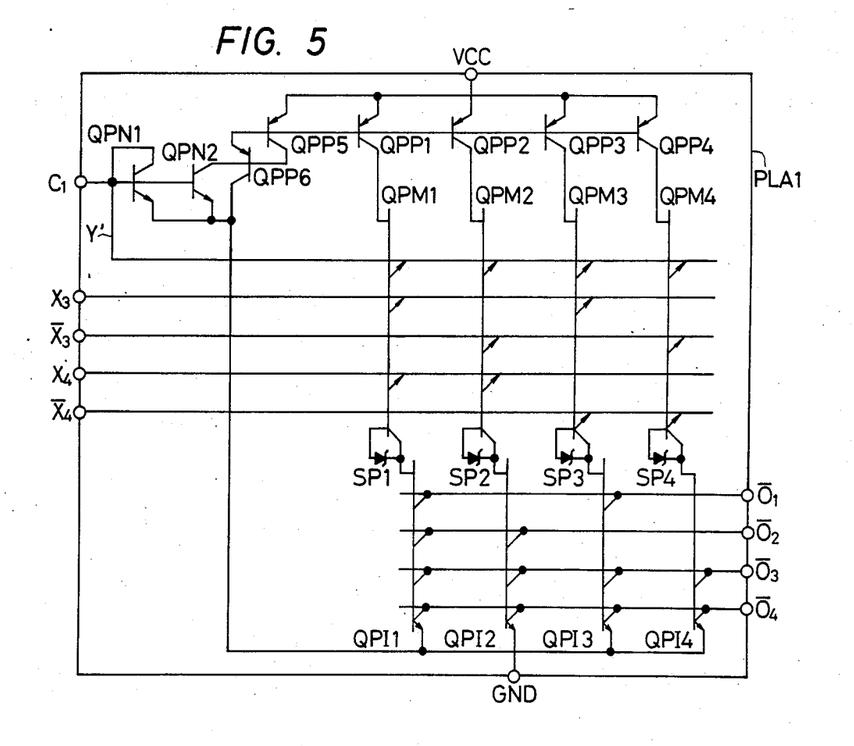
FIG. 5 is a diagram of a sub-PLA circuit.
Figure 6C:
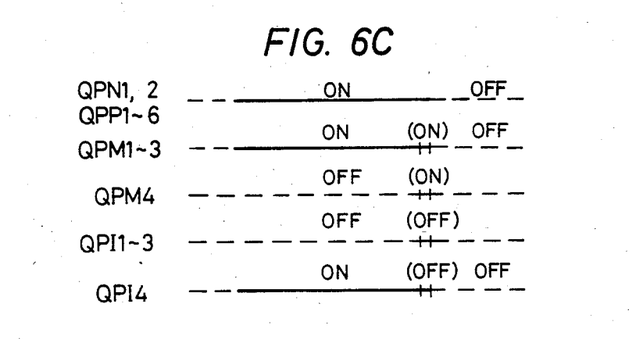

FIG. 5 is a diagram of the sub-PLA circuit, and FIG. 6C is a time chart of the circuit operation of FIG. 5.

In FIG. 5, symbols QPN1, QPN2 denote npn transistors, QPP1 to QPP6 denote lateral pnp transistors, QPM1 to QPM4 denote multi-emitter npn transistors, SP1 to SP4 denote Schottky barrier diodes, and QP11 to QP14 denote multi-collector inverse npn transistors.

Like the circuit of FIG. 4, the transistors QPN1, QPN2 that receive the output signal D1 of the decoder DEC through the bases thereof constitute a current mirror circuit together with the transistors QPP1 to QPP6, and supply a current proportional to the base current to the bases of the transistors QPM1 to QPM4 via the transistors QPP1 to QPP4. Here, the transistors QPN1, QPN2, and QPP1 to QPP6 correspond to the transistors QN1, QN2 and QP1, QP2 mentioned earlier with reference to FIG. 2.

Emitters of the transistors QPM1 to QPM4 are so connected (AND plane) that logical products of the input signals X3, $\overline{X3}$, X4, $\overline{X4}$ will render the collector outputs to assume the H level. As shown in FIGS. 6A and 6C, therefore, when the input signals X3, X4 have the L level and the input signals $\overline{X3}$, $\overline{X4}$ have the high level, the transistor QPM4 is rendered nonconductive among the transistors QPM1 to QPM4, and the transistor QP14 is rendered conductive. Therefore, the output signals $\overline{O1}$, $\overline{O2}$ assume the H level (open) and the output signals $\overline{O3}$, $\overline{O4}$ assume the L level due to collector wiring patterns of the transistors QP11 to QP14, i.e., due to a combinational logic (FIG. 5 shows the OR plane) programmed in advance for the logical products of input signals X3, 3, X4, 4. Then, as the outputs D1 to D4 of the decoder DEC change, the input control terminal C1 assumes the ground potential level, and the transistors QPN1, QPN2 and QPP1 to QPP6 are all rendered nonconductive. Therefore, no current is supplied to the sub-PLA, and the outputs $\overline{O1}$ to $\overline{O4}$ all assume the open state. Owing to the line Y' connecting the input control terminal C1 to the emitters of the transistors QPM1 to QPM4, however, the transistors QPM1 to QPM4 are all rendered conductive when the input control terminal C1 assumes the ground potential level irrespective of the input signals X3, $\overline{X3}$, X4, $\overline{X4}$, and the transistors QPI1 to QPI4 are all rendered nonconductive. The above-mentioned line Y corresponds to the signal line Y that connects the emitter of the transistor QM2 to the collector of the transistor QM1 in the first embodiment mentioned earlier, and produces the same effect; i.e., the line Y' helps render the transistors QPI1 to QPI4 nonconductive at a high speed when the level of the input control terminal C1 changes to the ground potential level "L", i.e., helps accomplish the so-called switching operation at a high speed. Here, the transistors QPM1 to QPM4 and QPI1 to QPI4 correspond to the transistors QM21 and QN31 of FIG. 2. The Schottky barrier diodes SP1 to SP4 work to prevent the positive holes injected through the bases from flowing into the p-type semiconductor substrate when the operation of the transistors QPM1 to QPM4 is saturated, like the case mentioned earlier with reference to FIG. 4. Namely, the Schottky barrier diodes work to reduce the amount of positive holes accumulated in the collectors and to increase the switching speed of the transistors and, hence, need not necessarily be provided. When other sub-PLA's 2 to 4 are working or when the number of input/output signals is changed, wiring pattern of the AND plane based upon the emitters of the transistors QPM1 to QPM4 or wiring pattern of the OR plane based upon the collectors of the transistors QPI1 to QPI4, should be changed to cope with the change.

Thus, the large-scale PLA based upon the TTL is divided into blocks as shown in FIGS. 3 to 5, and a block that is to be operated is designated by the outputs (D1 to D4) of the decoder DEC, so that the electric power will not be consumed by the unnecessary portions. Namely, there is realized a large-scale PLA circuit of the type of low power dissipation. Further, to a block having a switching function is adapted the fundamental unit circuit of the first embodiment in order to realize the TTL-type large-scale PLA circuit which features a very high switching operation.

According to the first and second embodiments of the present invention as described above, minority carriers accumulated in the transistors are quickly absorbed so that the TTL circuit exhibits a high switching operation. Moreover, the circuit is divided into blocks, and a block that is to be operated is designated by the outputs of the decoder while applying means for quickly absorbing minority carriers accumulated in the transistors. Therefore, there is realized the TTL-type large-scale PLA circuit which consumes reduced amounts of electric power and which exhibits a high switching operation.

Next, third to fifth embodiments of the present invention will be described below in conjunction with FIGS. 7 to 16.

Embodiment 3

Figure 7:
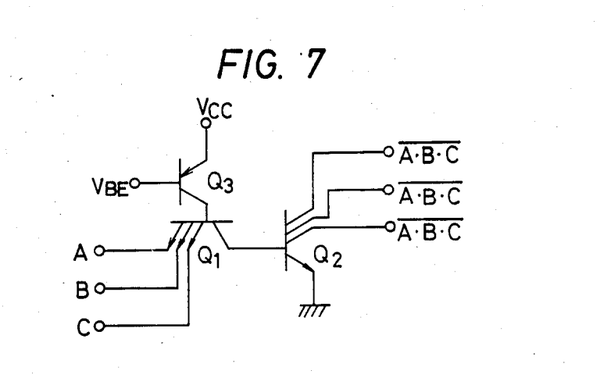
FIG. 7 is a diagram showing a circuit according to a third embodiment of the present invention.

In FIG. 7, a multi-emitter npn transistor Q1 produces a logical product of input signals A, B, C from the collector thereof, and inputs it to the base of a multi-collector npn transistor Q2 which operates reversely to the multi-emitter npn transistor Q1. The transistor Q2 inverts the logical product of signals A, B, C produced from the transistor Q1, and produces it from the collector thereof. A pnp transistor Q3 supplies to the base of the transistor Q1 a collector current which is determined by an emitter potential VCC and a base potential $V_{BE}$. The transistor Q3 may be replaced by a resistor of which the one end is connected to the power supply VCC and of which the other end is connected to the base of the transistor Q1.

Figure 8:
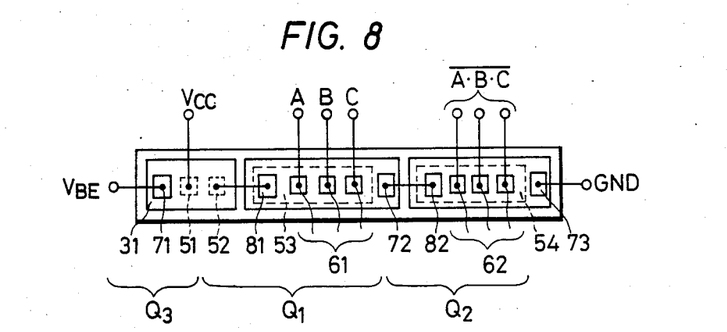
FIGS. 8 and 9 are a plan view and a section view of the third embodiment.
Figure 9:
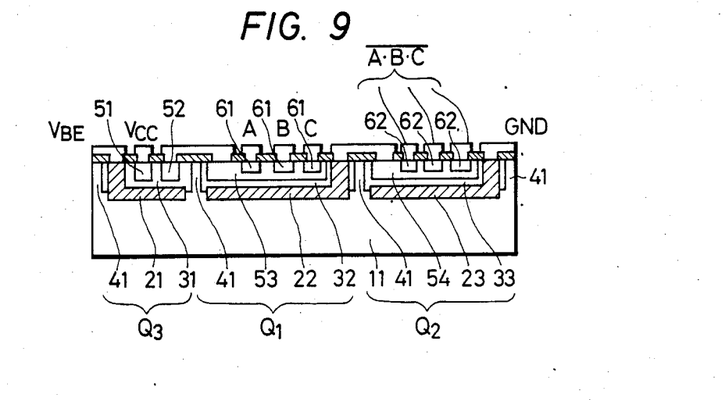

FIGS. 8 and 9 are a plan view and a section view of when the circuit of FIG. 7 is realized in the form of an integrated circuit. In the plan view of FIG. 8, the transistors Q3, Q1, Q2 of FIG. 7 are arranged in line. Reference numeral 61 denotes an n+-type mask pattern that serves as the emitter of the transistor Q1, 53 denotes a p-type mask pattern that serves as the base of the transistor Q1, 81 denotes a contact pattern for taking out the base terminal of the transistor Q1, and 72 denotes an n+-type mask pattern for taking out the collector of the transistor Q1. Further, reference numeral 62 denotes an n+-type mask pattern that serves as the collector of the transistor Q2, 54 denotes a p-type mask pattern that serves as the base of the transistor Q2, 82 denotes a contact pattern for taking out the base terminal of the transistor Q2, 73 denotes an n+-type mask pattern for taking out the emitter of the transistor Q2, 71 denotes an n+-type mask pattern for taking out the base of the transistor Q3, and reference numerals 51, 52 denote p-type mask patterns that serve as the emitter and collector of the transistor Q3, respectively.

In FIG. 9, reference numerals 31, 32, 33 denote epitaxial layers that contain n-type impurities, and wherein 31 denotes the base of transistor Q3, 32 denotes the collector of transistor Q1, and 33 denotes the emitter of transistor Q2. Reference numerals 21, 22 and 23 denote n+-type buried layers, and wherein 21 denotes the base of transistor Q3, 22 denotes the collector of transistor Q1, and 23 denotes the emitter of transistor Q2. Reference numeral 41 denotes element isolation regions formed by the diffusion of p+-type impurities, and 11 denotes a semiconductor substrate which contains p-type impurities.

Embodiment 4

A fourth embodiment will be described below in conjunction with FIGS. 10 to 12.

Figure 10:
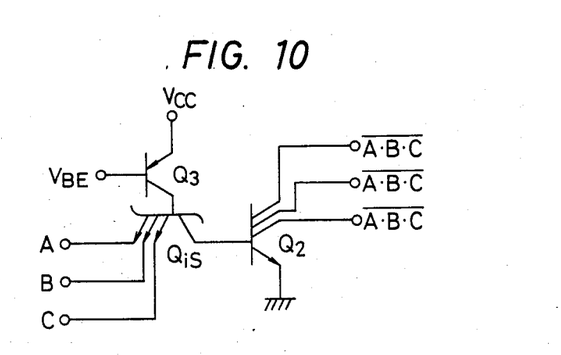
FIG. 10 is a diagram showing a circuit according to a fourth embodiment of the present invention.

FIG. 10 is fundamentally the same as the circuit of FIG. 7, but in which the multi-emitter transistor Q1 is substituted by a Schottky transistor Q1S to increase the operation speed.

Figure 11:
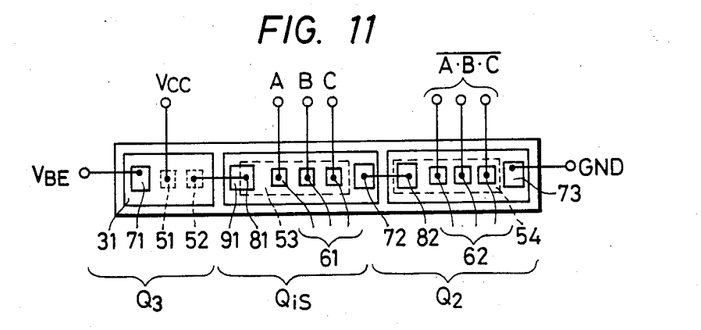
FIGS. 11 and 12 are a plan view and a section view of the fourth embodiment.
Figure 12:
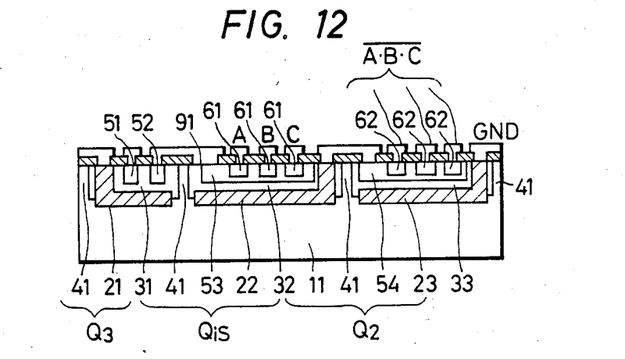

FIGS. 11 and 12 are also fundamentally the same as FIGS. 8 and 9, but in which a Schottky junction 91 is formed in the base contact 81 of the Schottky transistor Q1S. By substituting the Schottky transistor for the multi-emitter transistor, the delay time can be nearly halved.

Embodiment 5

The PLA according to a fifth embodiment will be described below in conjunction with FIGS. 13 to 15.

Figure 13:
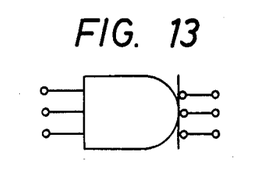
FIG. 13 is a symbolic diagram of FIG. 10.

The circuit of FIG. 10 is considered to be a unit logic circuit and is represented by a symbol of FIG. 13.

Figure 14:
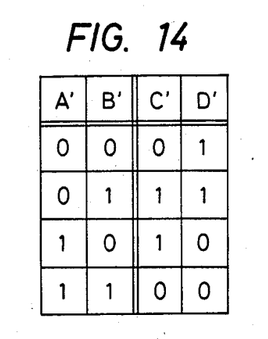
FIG. 14 is a truth table of the logic circuit of FIG. 8.

A truth table of FIG. 14 expresses a logic which produces signals C', D' for the input signals A', B'. FIG. 15 shows a logic circuit which is constituted using the circuits represented by the symbol of FIG. 13, and which establishes the logic of FIG. 14.

Figure 15:
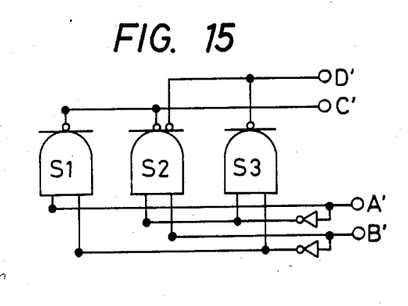
FIGS. 15 and 16 are a symbolic diagram and a section view of a fifth embodiment.
Figure 16:
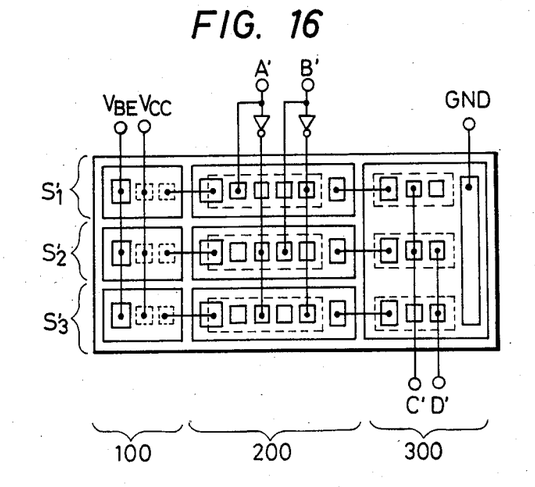

FIG. 16 is a plan view of the embodiment of logic circuit of FIG. 15.

The logic circuits S1, S2, S3 of FIG. 15 corresponds to the sections S1', S2', S3' of FIG. 16. The circuit of FIG. 16 is comprised of the circuits of FIG. 11 that are arranged in a vertical direction and that are wired to one another. In a multi-collector transistor section 300, the npn transistors are operated in the reverse directions, and there is no need of isolating the elements among the circuits S1, S2, S3. Therefore, the transistors are formed in the same element regions. To realize the circuit of FIG. 16 in view of the symbolic diagram of FIG. 15, the wiring corresponding to the input wiring of FIG. 15 should be connected among the emitters of the multi-emitter transistor section 200 of FIG. 16, and the wiring corresponding to the output wiring of FIG. 15 should also be connected among the collectors of the multi-collector transistor section 300 to FIG. 16.

Namely, the circuits of FIG. 11 are vertically arranged, and the number of emitters of the multi-emitter transistor and the number of collectors of the multi-collector transistor are increased or decreased depending upon a desired number of logical inputs and outputs. That is, the wiring is provided to correspond to the inputs and outputs, thereby to easily constituted any logic. This means that the present invention makes it possible to realize a PLA which consumes reduced amounts of electric power and which is highly integrated, by making use of bipolar transistors.

In FIG. 16, the multi-emitter transistor section 200 corresponds to the AND plane of PLA and the multi-collector transistor section 300 corresponds to the OR plane of PLA. In the OR plane section 300, furthermore, the npn transistors are operated in the reverse direction and can, hence, be connected without any logic level converter circuit to an IIL (integrated injection logic) which forms a logic gate of a minimum area relying upon bipolar elements.

According to the third to fifth embodiments of the present invention in which the inverter portion in the TTL circuit is replaced by an inverse npn transistor, the area required for constituting a three-input NAND circuit can be reduced to one-third and the consumption of electric power can be reduced to one-tenth. Furthermore, since the elements are regularly arranged, there is constituted a PLA which is highly integrated and which consumes reduced amounts of electric power.

Symbols used in the foregoing description are summarized below.

Symbols chiefly used in Embodiments 1 and 2 are as follows:
QM1, QM2, QM11, QM21, QDM1 to QDM4, QPM1 to QPM4: multi-emitter npn transistors
QN1, QN2, QN11, QN21, QDN1, QDN2, QPN1, QPN2: npn transistors
QP1, QP2, QP11, QP21: pnp transistors
QN3, QN31: npn transistors
IN: input circuit block
DEC: decoder
PLA1 to PLA4: sub-PLA's
QDP1 to QDP6, QPP1 to QPP6: lateral pnp transistors
SD1 to SD4, SP1 to SP4: Schottky barrier diodes
QPI1 to QPI4: multi-collector inverse npn transistors
Y, Y': signal lines Symbols chiefly used in the embodiments 3 to 5 are as follows:
VCC: power supply voltage
R1, R2, R3, R4: resistors
Q1': multi-emitter npn transistors
Q2', Q3', Q4': npn transistors
D1': diode
A, B, C: input signals
$\overline{A.B.C.}$: output signals
$V_{BE}$: base potential of pnp transistor
Q1: multi-emitter npn transistor
SQ1S: multi-emitter Schottky transistor
Q2: multi-collector npn transistor
Q3: pnp transistor
GND: ground potential
S1, S2, S3: symbols of logic circuits
S1', S2', S3': logic circuits corresponding to S1, S2, S3
A', B': input signals
C', D': output signals
11: p-type substrate
21, 22, 23: $n^+$-type buried layers
31, 32, 33: n-type epitaxial layers
41: $p^+$-type diffusion regions
51, 52, 53, 54: p-type diffusion regions
61, 62: $n^+$-type diffusion regions
71: base contact pattern of pnp transistor
72: collector contact pattern of npn transistor
73: emitter contact pattern of inverse npn transistor
81: base contact pattern of npn transistor
82: base contact pattern of inverse npn transistor
91: Schottky junction pattern

What is claimed is:

1. A logic circuit comprising:
a first multi-emitter transistor having a first base conductivity type, with its emitters coupled to a group of first input lines, and with its base coupled to a bias means;
a current source having an input and an output, said input being coupled to the collector of said first multi-emitter transistor, wherein output current from said output is substantially equal or proportional to input current into said input;
a second multi-emitter transistor having the first base conductivity type, with its base coupled to said output of said current source; and a first transistor having the first base conductivity type, which has one or more collectors, with its base coupled to the collector of said second multi-emitter transistor, with its emitter coupled to common line, and with one or more collectors coupled to one or more output lines, wherein one of the emitters of said second multi-emitter transistor is coupled to the collector of said first multi-emitter transistor, and wherein the rest of the emitters of said second multi-emitter transistor are coupled to a group of second input lines.

2. A logic circuit according to claim 1 comprising:

at least one input circuit block which produces non-inverted and inverted signals responsive to plural input signals;

at least one decoder which produces current signals responsive to a part of said non-inverted and inverted signals; and plural sub-PLA's which produce output signals that correspond to a logic combination of the rest of said non-inverted end inverted signals, wherein each one of said sub PLA's is controlled by a specified one of said current signals produced by said decoder, wherein said first multi-emitter transistor is included in said decoder, and further wherein said current source, said second multi-emitter transistor and said first transistor are included in said sub PLA's.

3. A logic circuit according to claim 1, wherein said first and second multi-emitter transistors have emitters in one base region, respectively, and further wherein one or more of said first transistors have one or more collectors in one base region.

4. A logic circuit according to claim 2, wherein specified emitters of said first and second multi-emitter transistors are connected selecticely to each other, and specified collectors of a plurality of said first transistors are connected selectively to each other, in order to provide a specified logic implentation.

* * * * *